United States Patent
Higashide et al.

(10) Patent No.: US 6,295,222 B2
(45) Date of Patent: Sep. 25, 2001

(54) SEMICONDUCTOR MEMORY DEVICE WITH TWO LAYERS OF BIT LINES

(75) Inventors: Yoshiko Higashide; Shigeki Ohbayashi, both of Tokyo (JP)

(73) Assignee: Mitsubishi Kabushiki Kaisha, Tokyo (JP)

(*) Notice: Subject to any disclaimer, the term of this patent is extended or adjusted under 35 U.S.C. 154(b) by 0 days.

(21) Appl. No.: 09/769,385

(22) Filed: Jan. 26, 2001

(30) Foreign Application Priority Data

Jan. 28, 2000 (JP) .................................................. 12-019897

(51) Int. Cl.⁷ ....................................................... G11C 5/06
(52) U.S. Cl. ................................. 365/63; 365/51; 365/72; 365/210; 365/208; 365/190; 365/156
(58) Field of Search .................................. 365/51, 63, 72, 365/210, 208, 190, 154, 156

(56) References Cited

U.S. PATENT DOCUMENTS

| | | | |
|---|---|---|---|
| 5,280,441 | * 1/1994 | Wada et al. | 365/63 |
| 5,379,248 | 1/1995 | Wada et al. | 365/63 |
| 5,563,820 | * 10/1996 | Wada et al. | 365/63 |
| 5,699,308 | * 12/1997 | Wada et al. | 365/200 |
| 5,892,704 | * 4/1999 | Lattimore et al. | 365/63 |
| 6,009,010 | * 12/1999 | Ohkubo | 365/154 |

FOREIGN PATENT DOCUMENTS

| | | | |
|---|---|---|---|
| 4322460 | 11/1992 | (JP) | H01L/27/11 |
| 6259968 | 9/1994 | (JP) | G11C/11/41 |

* cited by examiner

*Primary Examiner*—Andrew Q. Tran

(57) ABSTRACT

A semiconductor memory device according to the present invention comprises, in general, a memory cell array, a plurality of first-layer and second-layer bit lines. The memory cell array includes a matrix of memory cells arranged along a line and row directions, each memory cell being formed within a memory cell region. Each of first-layer bit lines is extending along the row direction, and provided on a plurality of the memory cell regions. Each of second-layer bit lines is connected with the first-layer bit line via a connecting hole. The memory cell regions include first and second memory cell regions, the first memory cell region is provided with the connecting hole, the second memory cell region is not provided with the connecting hole. Also, at least one of the memory cells formed within the first memory cell regions is a dummy cell incapable of electrically serving as the normal memory cell.

10 Claims, 12 Drawing Sheets

62g, 62i: DRAIN-SOURCE REGIONS OF
LOAD TRANSISTORS (ACTIVE LAYERS)

201a,201b:LOAD TRANSISTORS

SEMICONDUCTOR MEMORY DEVICE WITH TWO LAYERS OF BIT LINES

BACKGROUND OF THE INVENTION

1) Technical field of the Invention

The present invention relates to a semiconductor memory device including two layers of bit lines formed thereon.

2) Description of Related Arts

Semiconductor memory devices used in the recent office automation equipments, for example, a personal computer and a word processor, demand the semiconductor memory devices capable of storing and reading larger amount of data. In order to meet this demand, a variety of approaches have been proposed up to the present. Among others, commonly assigned U.S. Pat. Nos. 5,280,441 and 5,379,820 both granted to Wada et al. disclose a circuit design with a T-shaped bit line for connection between the memory device and circuits arranged therearound, which decreases limitations on the circuit and allows the circuits to be arranged in a suitable manner around the memory device. Also, commonly assigned U.S. Pat. Nos. 5,563,820 and 5,699,308 both granted to Wada et al. teach an integrated semiconductor memory device, of which high density is achieved by appropriately adjusting intervals between the adjacent first-layer bit lines. The aforementioned U.S. patents are incorporated herein by reference in this patent application.

When the integration of MOSFETs formed beneath the first-layer bit line is greater than that of metal wire layers, it is expected that the dimensions of memory cell regions may be subject to those of the dimensions of the first-layer and second-layer bit lines.

In particular, when the through-hole acting as a connecting hole between the first-layer and second-layer bit lines is arranged on a memory cell region, the interval of adjacent first-layer bit lines are extended so that the dimension of the memory cell region should also be extended. Thus, the dimension of a memory cell arrays is extended, and the area thereof is increased. In other words, this causes the enlargement of the memory cell array, preventing the array from being highly integrated.

Details of prior arts and defects thereof are also described in the description of the Japanese Patent Application No. 11-347449, filed by the applicant.

SUMMARY OF THE INVENTION

The present invention is to address to the aforementioned problem, and an object thereof is to prevent the dimensions of memory cell array from being extended due to an existence of the connecting holes even where the dimension of memory cell regions may be determined by those of first-layer and second-layer bit lines.

The semiconductor memory device according to the first invention comprises: a memory cell array including a matrix of memory cells arranged along line and row directions, each memory cell being formed within a memory cell region; a plurality of first-layer bit lines extending along the row direction, each provided on a plurality of the memory cell regions; and a plurality of second-layer bit lines, each of which is connected with the first-layer bit line via a connecting hole; wherein the memory cell regions include first memory cell regions on which the connecting hole is provided, and second memory cell regions on which the connecting hole is not provided, and wherein at least one of the memory cells formed within the first memory cell regions is a dummy cell incapable of serving an electrical memory operation.

The semiconductor memory device according to the second invention comprises: a memory cell array including a matrix of memory cells arranged along line and row directions, each memory cell being formed within a memory cell region; a plurality of first-layer bit lines extending along the row direction, each provided on a plurality of the memory cell regions; and a plurality of second-layer bit lines, each of which is connected with the first-layer bit line via a connecting hole; wherein the memory cell regions include first memory cell regions on which the connecting hole is provided, and second memory cell regions on which the connecting hole is not provided, and wherein at least one of the memory cells formed within the memory cell regions adjacent to the first memory cell regions along the line direction is a dummy cell incapable of serving an electrical memory operation.

In the semiconductor memory device according to the third invention, each memory cell is connected with a pair of the first-layer bit lines, one of the pair of the first-layer bit lines is connected with one of the second-layer bit lines through the connecting hole within the memory cell region of the dummy cell, and another one of the pair of the first-layer bit lines is connected with one of the second-layer bit lines through the connecting hole within the memory cell region of the memory cell capable of serving the electrical memory operation.

In the semiconductor memory device according to the fourth invention, two or four of the memory cell regions of the dummy cells are arranged in series along the row direction.

Also, the semiconductor memory device according to the fifth invention further comprises: a plurality of dummy cell bit lines connected with the dummy cells for maintaining the dummy cells to a GND potential.

In the semiconductor memory device according to the sixth invention, the memory cell array further includes a GND line extending along the row direction, each of the dummy cell is connected with the GND line via the dummy cell bit lines.

In the semiconductor memory device according to the seventh invention, each of the dummy memory cell includes a pair of memory node portions and a pair of load transistors with drain-source regions, and each drain-source region is disconnected with any of the memory node portions.

Further scope of applicability of the present invention will become apparent from the detailed description given hereinafter. However, it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention become more fully understood from the detailed description given hereinafter and accompanying drawings which are given by way of illustration only, and thus are not limitative of the present invention and wherein.

DETAILED DESCRIPTION OF THE PREFERRED EMBODIMENTS

Embodiment 1

Figure 1:
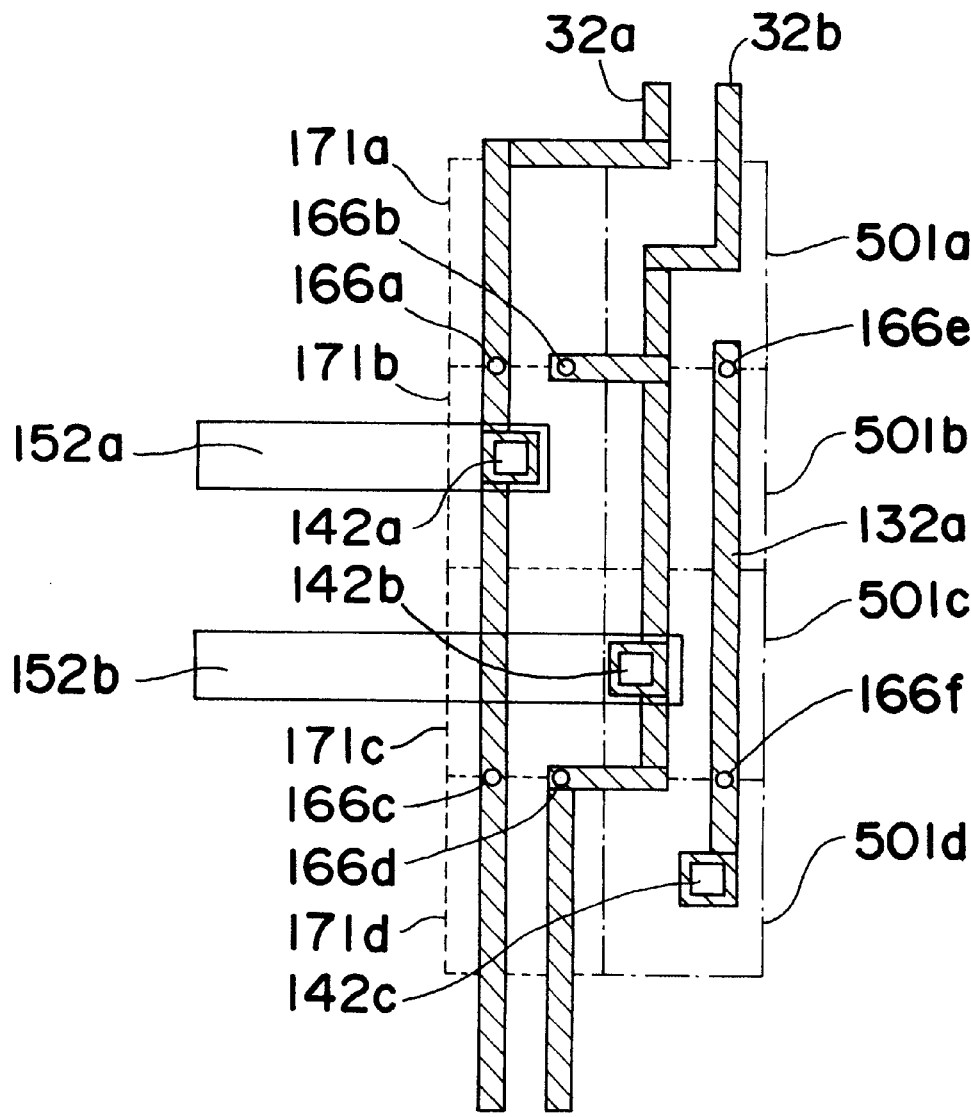
FIG. 1 is a design pattern of a memory cell array according to Embodiment 1 of the present invention.

FIG. 1 is a design pattern of a memory cell array of a SRAM (Static Random Access Memory) according to Embodiment 1 of the present invention, including eight memory cells arranged in a 4×2 matrix, with four memory cells in a row direction and two memory cells in a line direction, each being outlined by dotted or imaginary lines. Also, first-layer and second-layer bit lines are illustrated in a hatched form to distinguish them from others for the purpose of clarification.

Reference numerals 171a to 171d denote memory cell regions, which serves as electrically operable memory cells. (Hereinafter, memory cells and memory cell regions are referred to as normal cells and normal cell regions, respectively.) Reference numerals 501a to 501d denote memory cell regions, which serves as electrically inoperable memory cells. (Hereinafter, memory cells and memory cell regions are referred to as dummy cells and dummy cell regions, respectively.) Each of the normal and dummy cell regions are illustrated to have substantially the same size, although the dimensions of the normal and dummy cell regions may be manufactured in different sizes. Also, each of patterns beneath the first bit lines in normal and dummy cell regions have substantially the same sizes.

Reference numerals 32a, 32b and 132a denote first-layer bit lines made of metal wire layers. Reference numerals 152a and 152b denote second-layer bit lines made of metal wire layers.

As shown in FIG. 1, the first-layer bit lines 32a and second-layer bit lines 152a and 152b are paired with each other, respectively. The first-layer bit line 32a is connected with memory devices provided in normal cell regions 171a and 171b through a bit line contact 166a and with memory devices provided in normal cell regions 171c and 171d through a bit line contact 166c. On the other hand, the first-layer bit line 32b, which has a vermiculate configuration, is connected with memory devices provided in normal cell regions 171a and 171b through a bit line contact 166b and with memory devices provided in normal cell regions 171c and 171d through a bit line contact 166d. The first-layer bit line 32b is formed on the dummy cell regions 501a to 501d, without being connected with the dummy cell regions through the bit line contact.

The first-layer bit line 132a is a bit line for dummy cells (referred to as a "dummy cell bit line") and is connected with dummy memory cells 501a and 501b through the bit line contact 166e and with dummy cells 501c and 501d through a bit line contact 166f.

The first-layer bit line 32a is connected with the second-layer bit line 152a via a through-hole 142a in the normal cell region 171b. The first-layer bit line 32b is connected with the second-layer bit line 152b via a through-hole 142b in the dummy cell region 501c.

Also, the first-layer bit line 132a is connected with the second-layer bit line, which is not shown in this drawing, via the through-hole 142c.

By the way, a boundary line along the line direction between memory cell regions of an adjacent first and second normal cells is defined such that it follows on the middle points of the minimum distance between edges of adjacent first-layer bit lines on the first and second normal cells, and extends parallel with the row direction.

In case where the normal cell is adjacent to the dummy cell, the boundary line therebetween is defined as an extending line of the aforementioned boundary line between memory cell regions of adjacent first and second normal cells.

The width of the memory cell regions along the line direction is defined as a minimum distance between the right and left boundary lines of one memory cell region.

Figure 2:
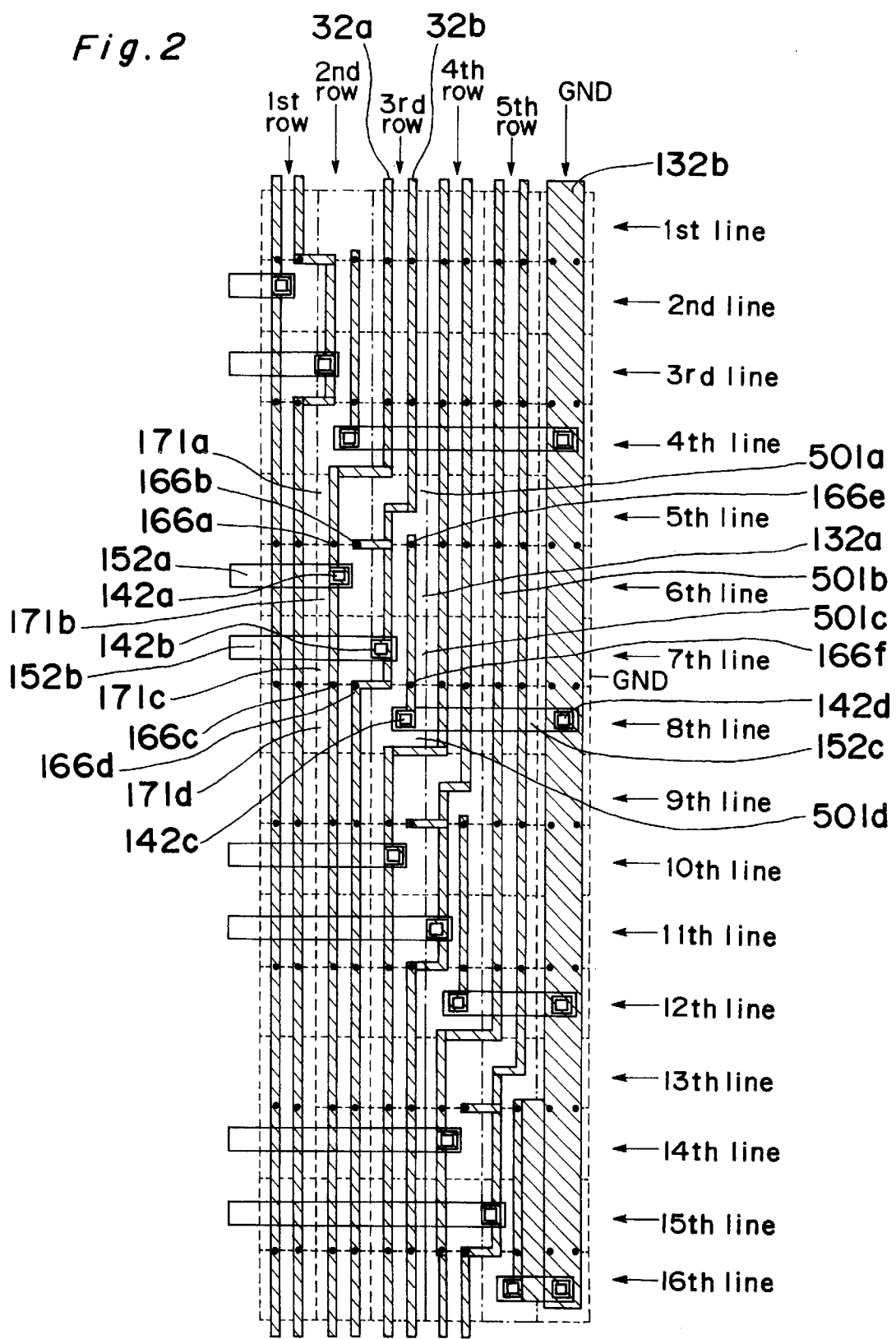
FIG. 2 is a design pattern of a memory cell array according to Embodiment 2 of the present invention.

As shown in FIG. 2 according to Embodiment 2 (although not shown in FIG. 1), the boundary lines along the line direction of the memory cell region located on the 11th line and second row, for example, are defined, at one side, by the boundary line thereof at the left side based upon a relationship between the adjacent normal cells located on the 11th line and first row and on the 11th line and the second row, and at another side, by the boundary line thereof at the right side based upon the relationship between the adjacent normal cells located on the 11th line and second row and on the 11th line and the third row.

Also, boundary lines along the row direction between adjacent memory cell regions are defined as follows. In a series of the first through fourth memory cell regions arranged along the row direction, and in general, the bit line contact is commonly connected with two adjacent memory cells such as the first and second memory cells, and the third and fourth memory cells. Therefore, boundary lines along the row direction between the first and second memory cells, and the third and fourth memory cells are defined such that they follows on the bit line contacts. Also, another boundary line along the row direction between the second and third memory cells is defined such that it traces on a middle position between the bit line contacts. Thus, the boundary lines along the row direction between adjacent memory cell regions are defined such that they follow on the bit line contacts or on the middle positions between the bit line contacts, and extend parallel in the line direction.

Therefore, the length of the memory cell regions along the row direction is defined as the minimum distance between the adjacent boundary lines along the row direction.

The dimensions and boundary lines of the memory cell regions are defined as above, however, any other definitions can be applied, when they represent a unit of a memory cell which memorizes one bit memory.

Next, the advantages according to Embodiment 1 as described above are described hereinafter. In Embodiment 1, a through-hole corresponding to one of the first-layer bit line is arranged on the normal cell region, and the dummy cell regions are arranged adjacent to the normal cell regions along the line direction. Thus, the another of the first-layer bit line can be arranged on the dummy cell regions. Therefore, the first-layer and second-layer bit lines can be constructed without extending the dimension along the line direction of each normal cell region even where the through-hole is arranged.

Also, the through-hole corresponding to the another bit line is arranged on the dummy cell regions so that the connection of the first-layer and second-layer bit lines can be realized without dimensional extension along the line direction of the normal cell regions due to the through-holes.

Further, each normal cell region has dimensions along the line and row directions, which are substantially the same as those of each dummy cell region so that a layout of the memory cell array can be simple, thereby to readily design the memory cell array.

Embodiment 2

Next, referring to FIG. 2, Embodiment 2 of the present invention is discussed hereinafter. FIG. 2 shows a pattern of the memory cell array including more memory cells than those shown in FIG. 1 of Embodiment 1. In particular, FIG. 2 shows the pattern of sixteen memory cells along the row direction, five memory cells in the line direction, and a plurality of first-layer and second-layer bit lines.

The pattern shown in FIG. 1 according to Embodiment 1 corresponds to a portion of the pattern shown in FIG. 2, which are defined by the memory cell regions on second and third rows and on the fifth to eighth lines.

As shown in FIG. 2, four dummy cell regions in series along the row direction compose a set of the dummy cell regions, which shifts by one row every four lines. For example, a set of the dummy cell regions is located on the first to fourth lines at the second row, and on the fifth to eighth lines at the third row.

The set of the four dummy cell regions basically has a function as follows. The dummy cell region 501a is a bending region where the first-layer bit line 32b is bent. The dummy cell region 501b is a spacing region where the first-layer bit line 32b is spaced from the through-hole 142a. The dummy cell region 501c is an arranging region where the through-hole 142b is arranged. The dummy cell region 501d is a connecting region where the through-hole 142c is connected with the dummy cell bit line 132a.

Further, a GND line is provided on the right side of memory cell regions arranged on the fifth row. The GND line is made of a metal wire for providing a GND potential, in which use of a first-layer metal wire 132b is illustrated in this instance.

The dummy cell bit line 132a for dummy cells 501a to 501d is connected with the first-layer metal wire 132b via the through-hole 142c, the second-layer metal wire 152c, and the through-hole 142d. Thus, the potential of the dummy cell bit line 132a is maintained to the GND potential.

Also, active region portions of dummy cell regions (not shown), which are connected with the bit line 132a via bit line contacts 166e and 166f, have their potentials maintained to the GND potential. Similarly, other dummy cell bit lines have the potentials maintained to the GND potential.

Next, the dimension of the memory cell array is described hereinafter. Since the conventional memory cell array consists of normal cells only, each of which has the same dimension, an arrangement of the through-holes causes the dimension of each memory cell region to be extended, thus, increasing the area of the memory cell array.

However, in case where the following conditions meet with arrangement of the dummy cell regions, the total area of the memory cell array can be substantially reduced or shrank.

Suppose if no through-hole is arranged on the memory cell region, then the memory cell array can be designed and manufactured as small as possible, in which the minimum width along the line direction of each normal memory cell region (each dummy cell region) is represented as "C". In addition, in order to arrange the through-holes in a conventional manner, the aforementioned width is required to be added by an increased width (represented as "a") along the line direction of each memory cell region. The row number of the memory cell regions arranged along the line direction is represented as "n". In case where only one of the above-mentioned set of the dummy cell regions is arranged in each row, the width along the line direction of the memory cell array are:

in the conventional case: (C+a)×n, and
in the case of this embodiment: C×(n+1).

Therefore, the area of memory cell array can be reduced or shrank with arrangement of the dummy cell regions, if the following condition formula is satisfied:

$$(C+a) \times n > C \times (n+1)$$

As described above, since four dummy cell regions are arranged in series along the row direction as a set of the dummy cell regions, the bit lines can be regularly arranged thereon. Thus, the memory cell array according to this embodiment can be designed in a simple manner.

Also, the active regions of dummy cells connected with the dummy cell bit lines and the bit line contacts have the potentials maintained to the GND potential so that the potentials of the dummy cell bit lines can be kept stable. Therefore, the GND potential can reduce adverse affects to the normal cells due to the astable potentials of dummy cell bit lines, and so on.

Further, the dummy cell bit lines are connected with the GND line so that no particular GND wire region for the dummy cell bit lines should be arranged. Thus, the area of the memory cell array can be substantially reduced.

When the row number (n) meets the aforementioned condition formula, the area of the memory cell array can be reduced or shrank with arrangement of the dummy cell regions, in comparison with the case where the area thereof is increased in the conventional manner.

Embodiment 3

Figure 3:
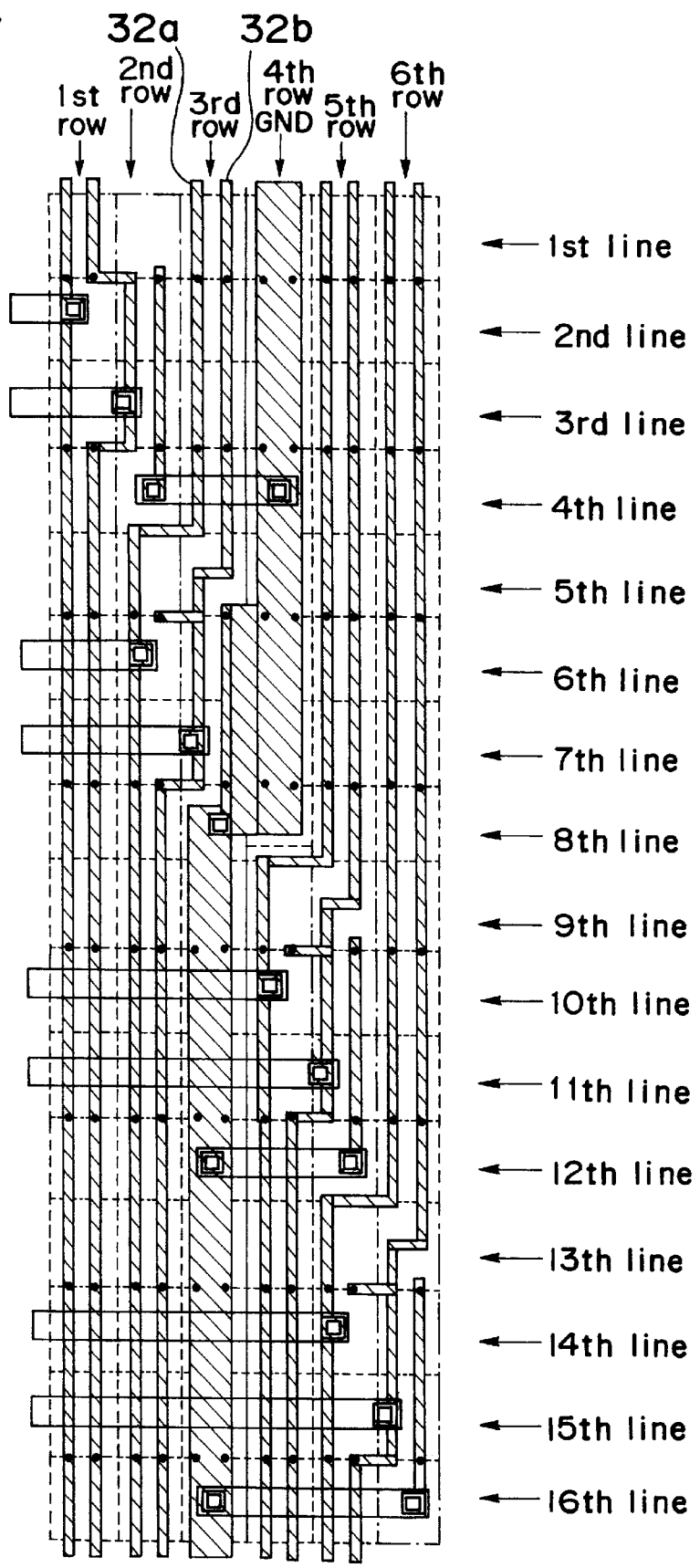
FIG. 3 is a design pattern of a memory cell array according to Embodiment 3 of the present invention.

FIG. 3 shows an another pattern of memory cell array according to Embodiment 3. While FIG. 2 according to Embodiment 2 shows the GND line formed on only one row in series along the row direction, FIG. 3 according to Embodiment 3 shows GND lines arranged on a plurality of lines along the row direction. In particular, the GND line is provided on the first to seventh lines at the fourth row, on the ninth to sixteenth lines at the third row, and on the third and fourth rows at eighth line. Thus, in case even where the GND line is continuously provided on a plurality of rows, the dummy cell regions can be arranged.

Embodiment 4

Figure 4:
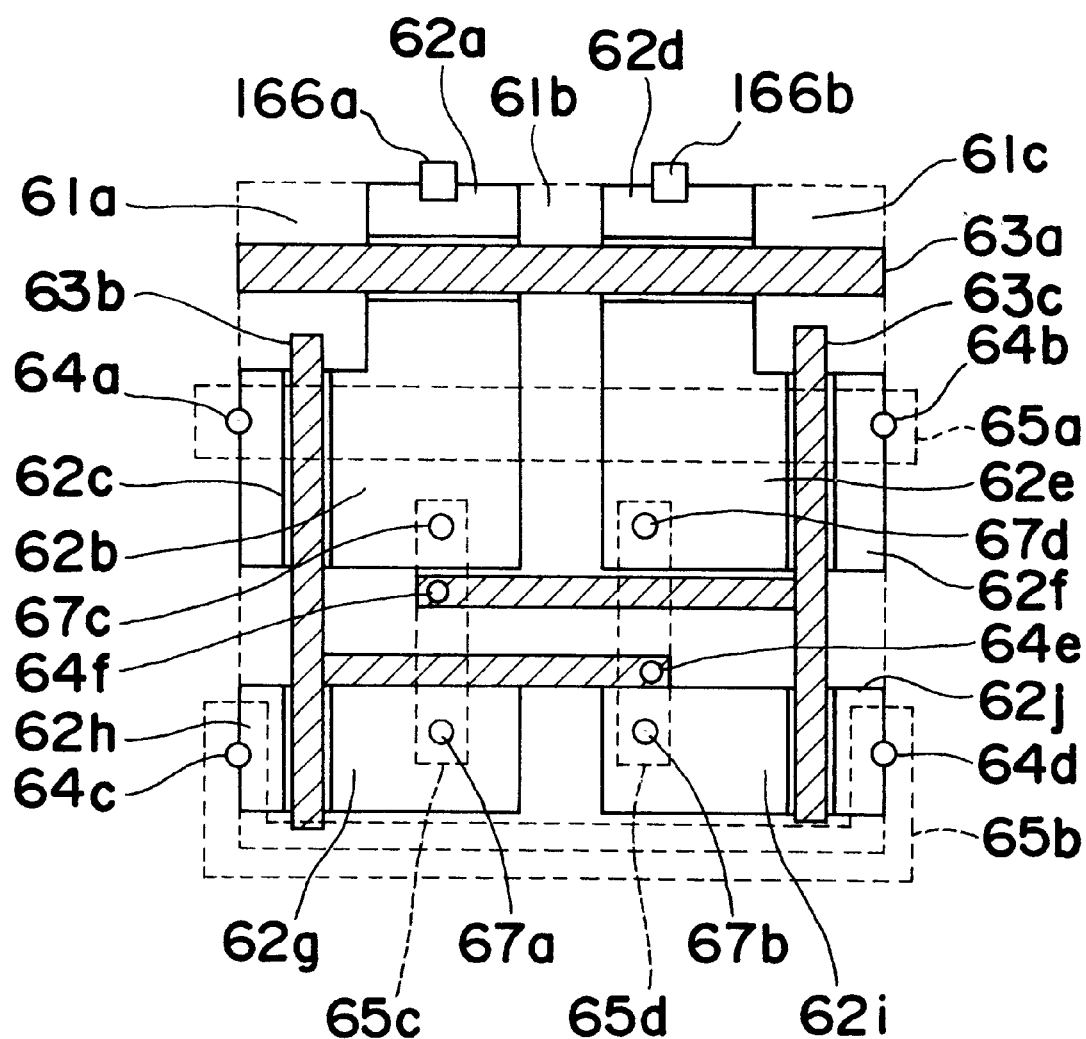
FIG. 4 is a design pattern of a memory cell according to Embodiment 4 of the present invention.
Figure 5:
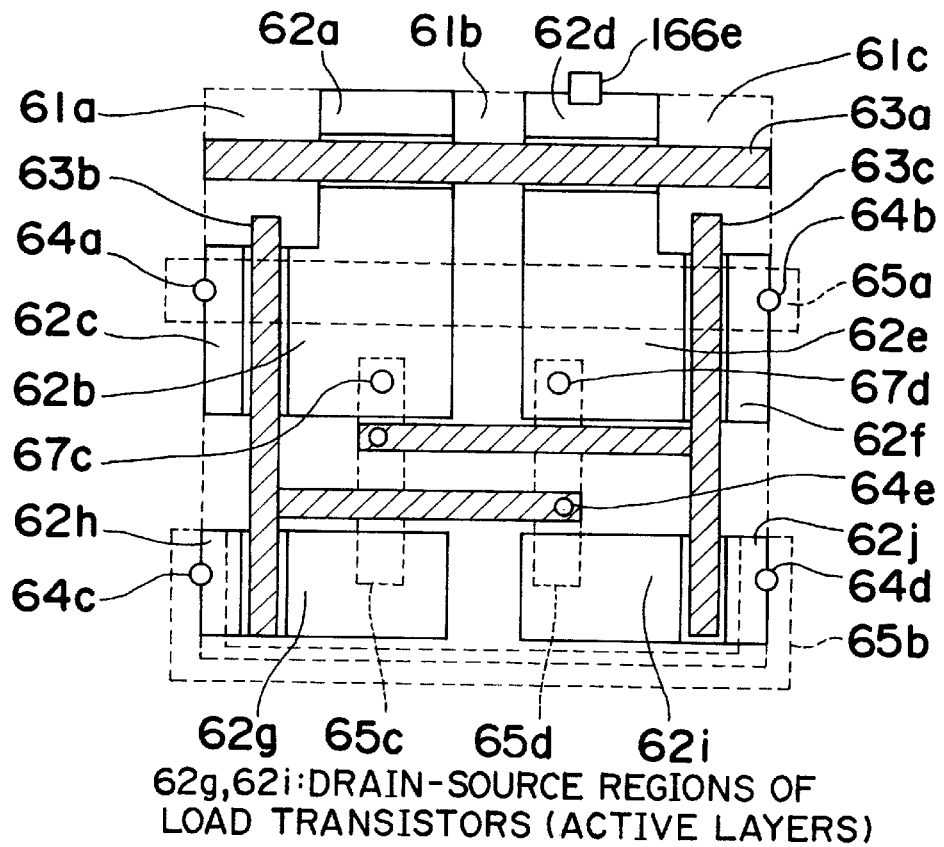
FIG. 5 is a design pattern of a dummy cell according to Embodiment 4 of the present invention.

Referring to FIGS. 4 and 5, Embodiment 4 is described hereinafter. FIGS. 4 and 5 show patterns beneath the first-layer metal wire of the normal cells and dummy cells shown in FIG. 1, respectively. Referring to the pattern of the normal cell shown in FIG. 4, reference numerals 61a to 61c denote separating insulative layers, reference numerals 62a to 62j denote active layers, reference numerals 63a to 63c denote poly-silicon layers, reference numerals 65a to 65d denote third-layer metal wires, reference numerals 64a to 64d and 67a to 67d denote first contacts connecting between the active layers and the third-layer metal wires, and reference numerals 64e and 64f denote second contacts connecting between the poly-silicon layers and the third-layer metal wires.

Reference numerals 65a and 65b denote a GND wire and a Vcc wire, respectively. In particular, reference numerals 64a and 64b are referred to as "GND contacts", and reference numerals 64c and 64d are referred to as "Vcc contacts". Reference numerals 166a and 166b are the bit line contacts as described in Embodiment 1 and 2, which connect between the first-layer bit lines 32a and 32b, and active layers 62a and 62d, respectively.

The active layers 62b, 62e, 62g, and 62i are to form memory nodes of the memory cell, in which memory data are stored. The active layers 62b and 62g are connected with each other via the first contacts 67c and 67a, respectively, and via the third-layer metal wire 65c so as to form one memory node. The active layers 62e and 62i are connected with each other via the first contacts 67d and 67b, respectively, and via the third-layer metal wire 65d so as to form the another memory node.

Also, the active layers 62c and 62f are connected with the GND wire 65a via the GND contacts 64a and 64b, thus, they are referred to as "GND active layers". Similarly, since the active layers 62h and 62j are connected with the Vcc wire 65b via the Vcc contacts 64c and 64d, they are referred to as "Vcc active layers". The poly-silicon layer 63a corresponds to a word line.

Figure 6:
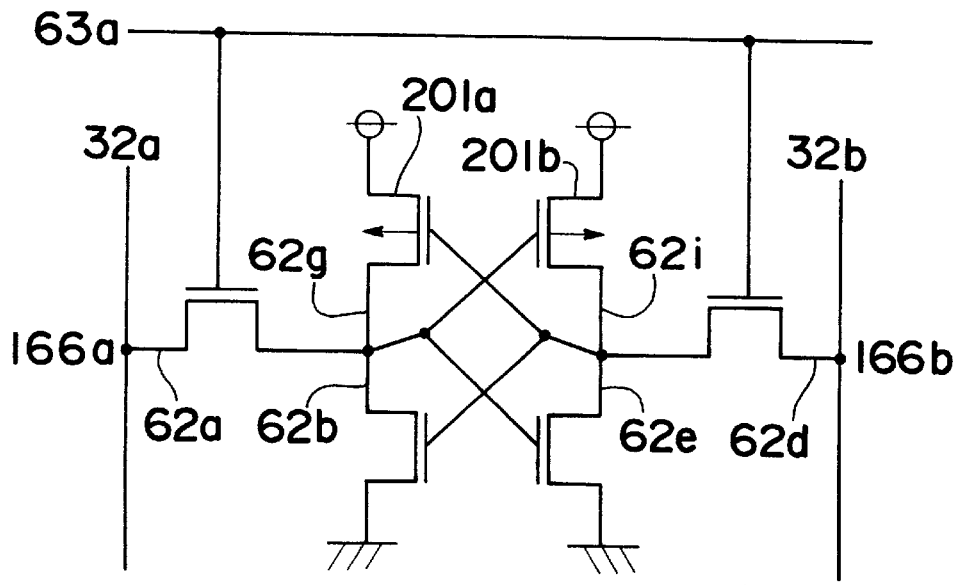
FIG. 6 is an equivalent circuitry diagram of the memory cell according to Embodiment 4 of the present invention.

FIG. 6 illustrates an equivalent circuitry of the normal cell shown in FIG. 4, in which the same reference numerals are used for corresponding principal parts shown in FIG. 4.

In FIG. 6, reference numerals 201a and 201b denote a pair of load transistors, and active regions 62g and 62i corresponds to source-drain regions of the load transistors.

FIG. 5 is a pattern of the dummy cell, which is similar to that shown in FIG. 4, except that no contact corresponding to the bit line contact 166a is provided, the bit line contact 166e is substituted for the bit line contact 166b and is connected with the dummy cell bit line 132a (See FIG. 2.), and no contact corresponding to the first contacts 67a and 67b is provided.

Figure 7:
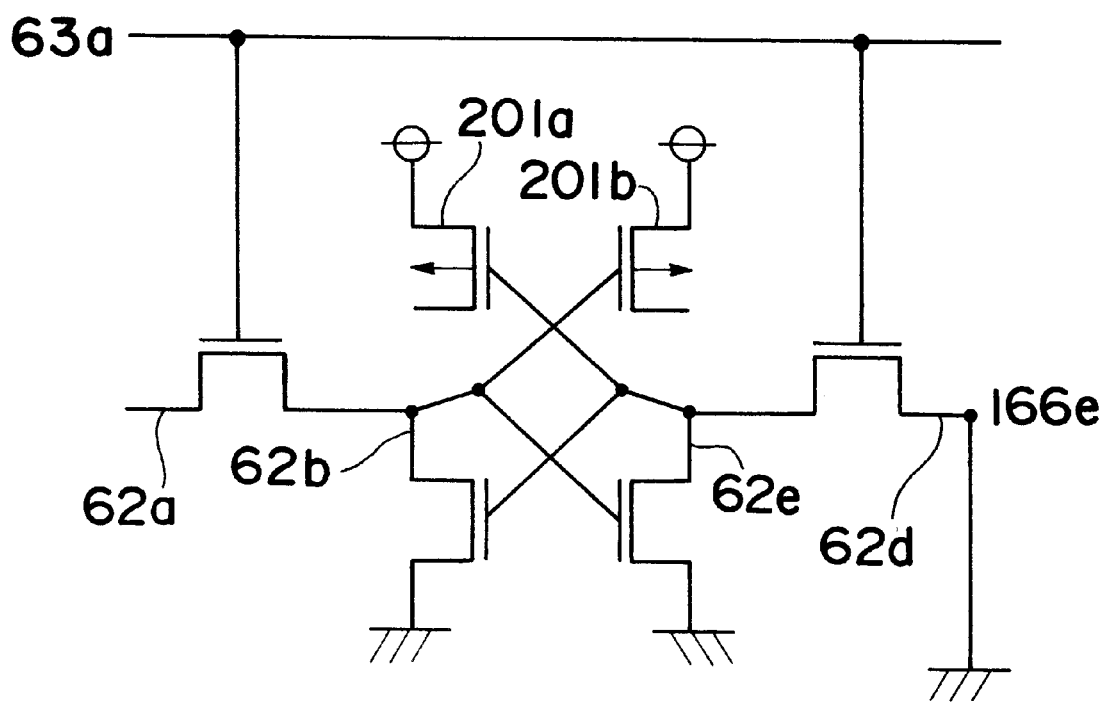
FIG. 7 is an equivalent circuitry diagram of the dummy cell according to Embodiment 4 of the present invention.

FIG. 7 shows an equivalent circuitry of the dummy cell shown in FIG. 5. In FIG. 7, since the first contact 67a is not provided, the active region 62g serving as the drain-source region of the load transistor 201a is not connected with the third-layer metal wire 65c forming a memory node so that no corresponding connection wire in the circuitry is provided.

Also, since the first contact 67b is not provided, the active region 62i serving as the drain-source region of the load transistor 201b is not connected with the third-layer metal wire 65d forming a memory node so that no corresponding connection wire in the circuitry is provided. Thus, the dummy cell cannot electrically perform the memory operation. As can be seen also in FIG. 2, the active region 62d is maintained to the GND potential via the bit line contact 166e.

According to the present embodiment, each dummy cell has a memory cell pattern substantially the same as that of each normal cell. Therefore, a plurality of consecutive patterns can be formed on the memory cell array so that problems such as malfunction of normal cells is unlikely caused in photolithography processes due to inconsecutive patterns.

Figure 8:
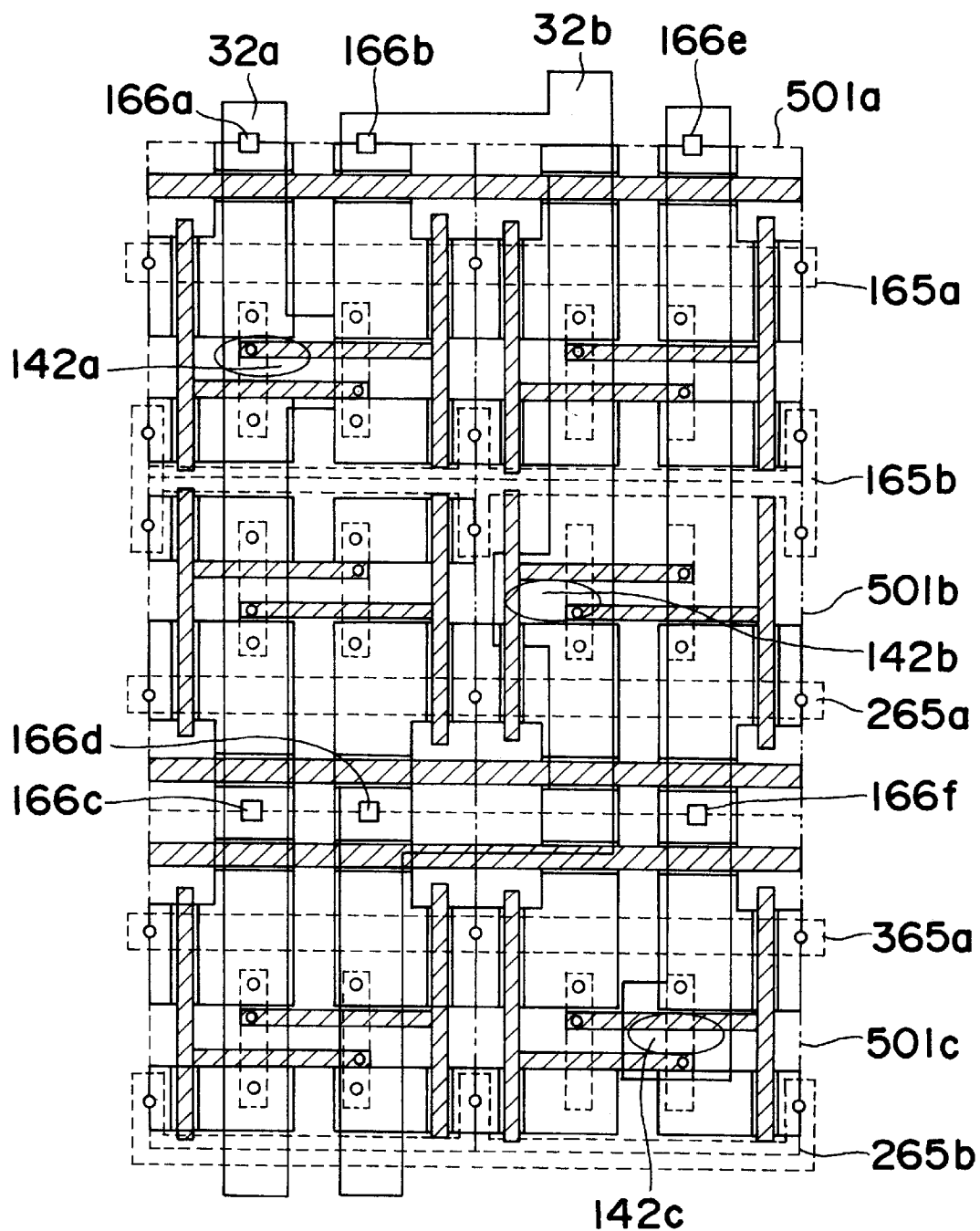
FIG. 8 is a design pattern of a memory cell array according to Embodiment 4 of the present invention.

FIG. 8 illustrates the patterns beneath the first-layer metal wire, which correspond to those according to Embodiment 1 shown in FIG. 1. The patterns beneath the first-layer metal wire of normal cells and dummy cells according to the present embodiment can be consecutively formed.

Also, the drain-source regions of the load transistors on dummy cells are designed to disconnect to memory nodes so that the dummy cells cannot electrically perform the normal memory operation. Thus, performance of each normal cell is not to be influenced because of the incapability of each dummy cell.

Furthermore, since the drain-source regions of the load transistors on dummy cell regions are designed to disconnect to the memory nodes, a current path between Vcc and GND is cut off so that a redundant current flowing through the dummy cells can be reduced.

Figure 9:
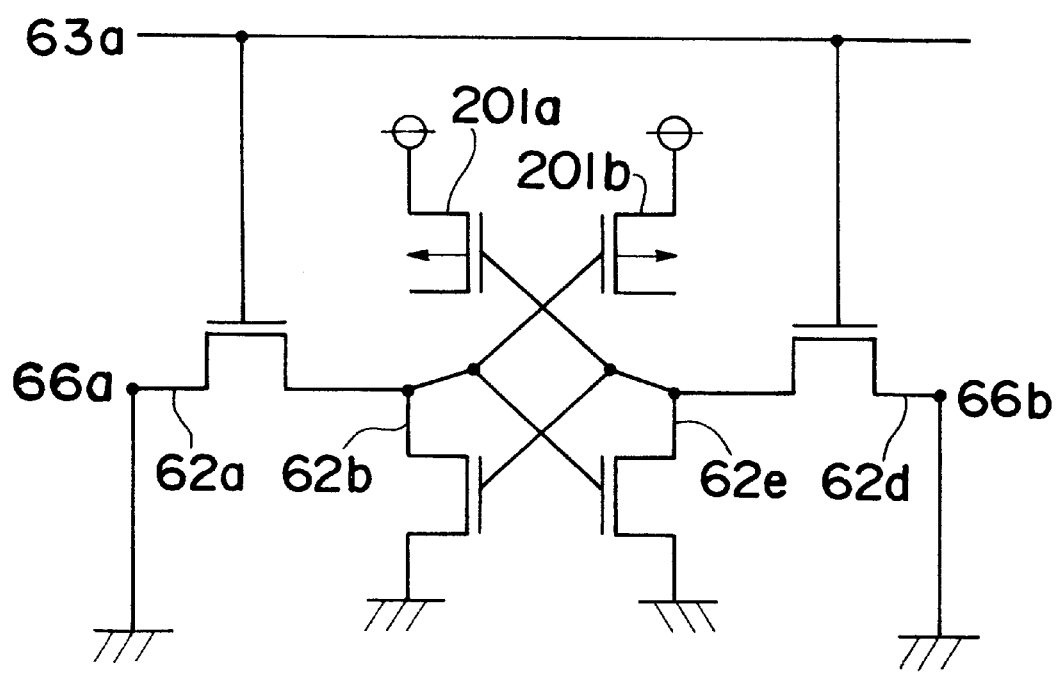
FIG. 9 is an equivalent circuitry diagram of the dummy cell according to Embodiment 4 of the present invention.

Moreover, as shown in FIG. 9, the bit line contact 66a, which connects to the wire maintained to the GND potential, is provided also with the active layer 62a so that the active region can be maintained to the GND potential via the bit line contact of the dummy cell.

Embodiment 5

Figure 10:
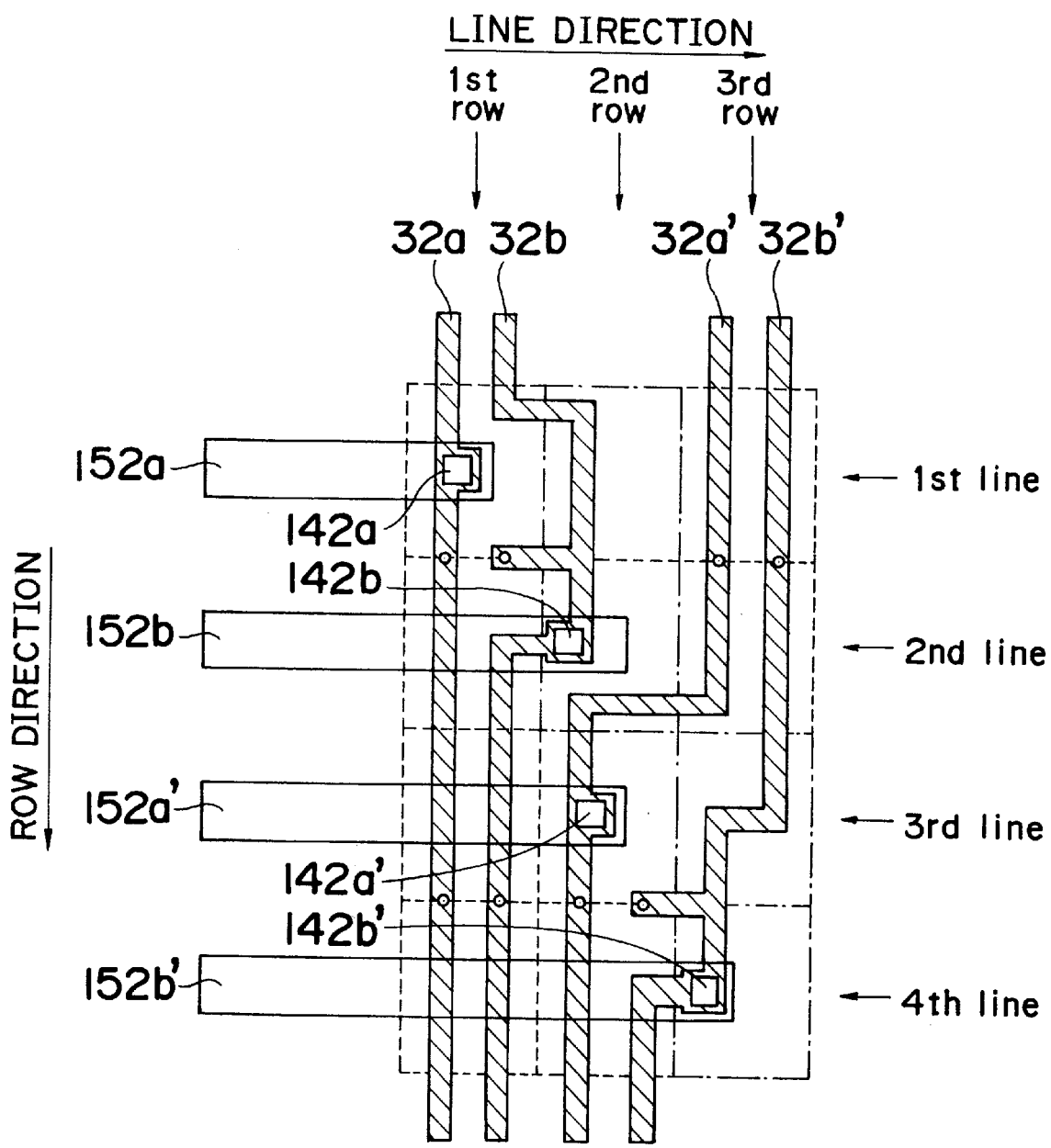
FIG. 10 is a design pattern of a memory cell array according to Embodiment 5 of the present invention.
Figure 11:
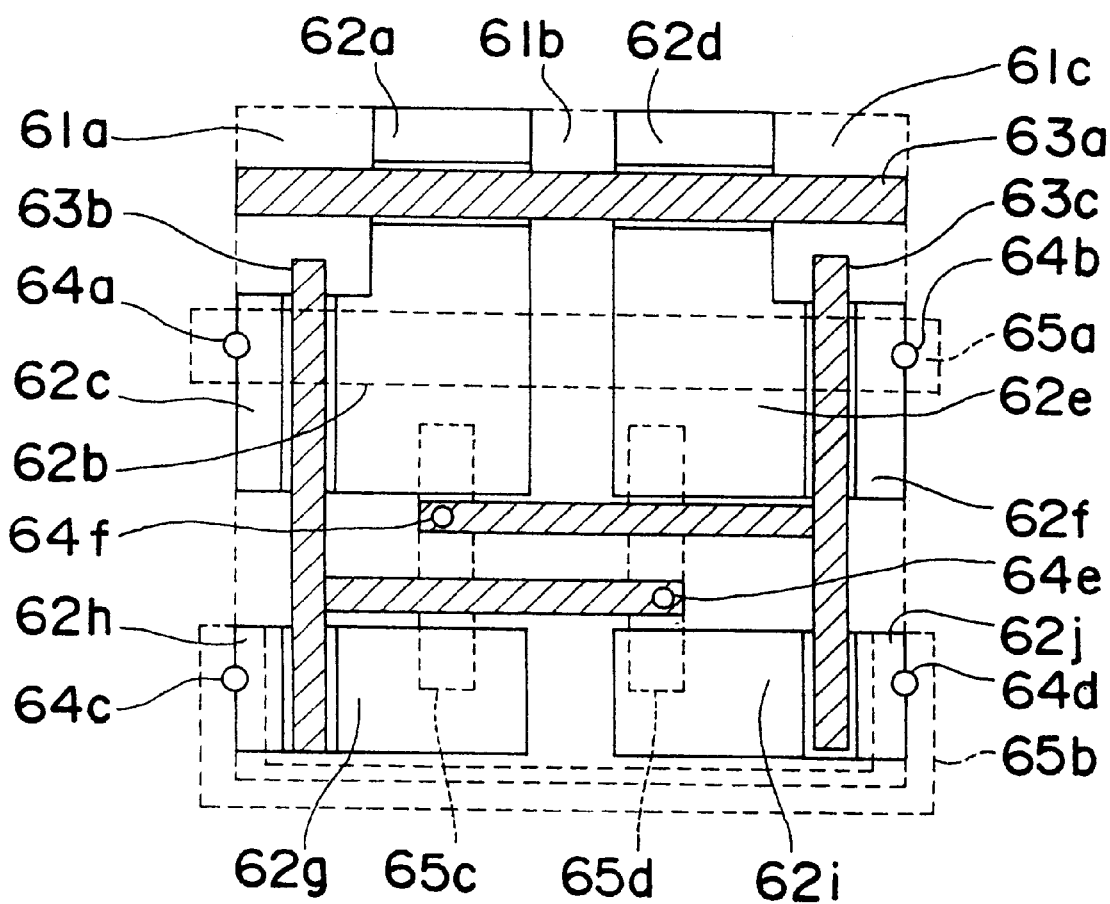
FIG. 11 is a design pattern of a dummy cell according to Embodiment 5 of the present invention.
Figure 12:
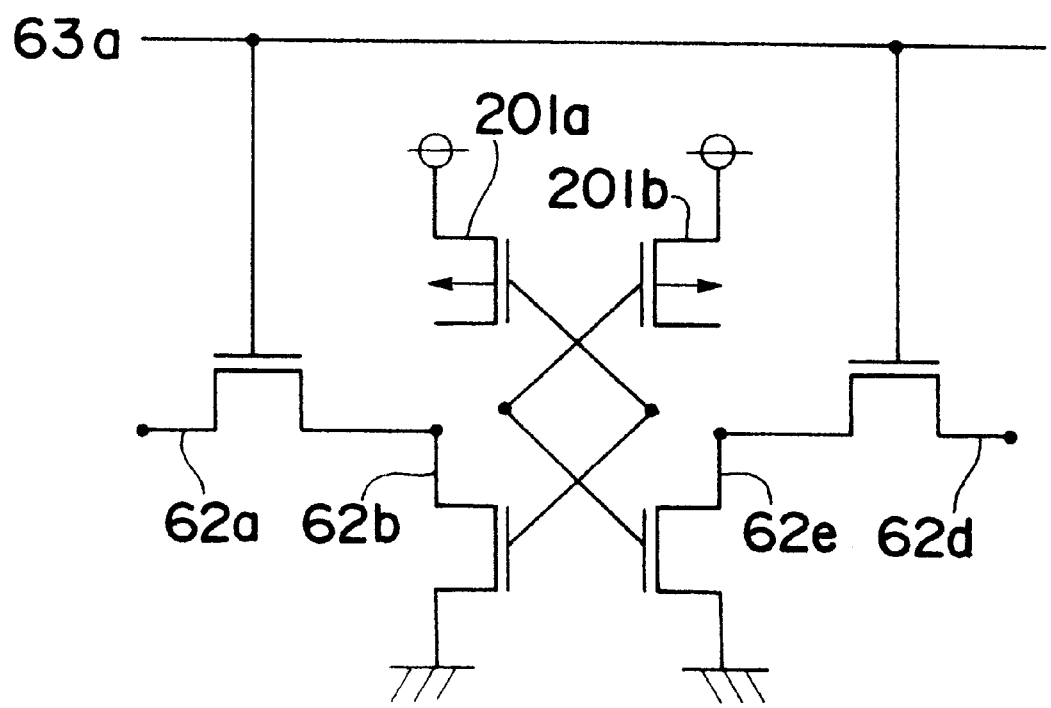
FIG. 12 is an equivalent circuitry diagram of the dummy cell according to Embodiment 5 of the present invention.

Referring to FIGS. 10 through 12, Embodiment 5 is described hereinafter. FIG. 10 is a pattern of the memory cell array according to Embodiment 5, which is similar to that shown in FIG. 2, except that a set of two dummy cell regions arranged in series along the row direction shifts by one row every two lines according to Embodiment 5 as shown in FIG. 10. Meanwhile, according to Embodiment 2 shown in FIG. 2, the set of four dummy cell regions arranged in series along the row direction shifts by one row every four lines. For example, the set of the dummy cell regions according to Embodiment 5 is located on the first and second lines at the second row, and on the third and fourth lines at the third row. The other memory cell regions in FIG. 10 are normal cell regions, each of which electrically performs the normal memory operation.

Also, in the memory cell array shown in FIG. 10, there provides no dummy cell bit line corresponding to dummy cell bit line 132a in FIG. 1.

FIG. 11 shows a pattern of the dummy cell according to Embodiment 5 beneath the first-layer metal wire, and FIG. 12 shows an equivalent circuitry of the dummy cell as shown in FIG. 11. FIGS. 11 and 12 are similar to FIGS. 5 and 6, respectively, except that since no dummy cell bit line connected with the GND line is provided, there provides no bit line contact and no contact corresponding to the bit line contact 166e and the first contact 67c and 67d, respectively.

The dummy cell according to Embodiment 5, which is not maintained to the GND potential, nevertheless, provides no adverse affect the normal cells.

Embodiment 6

Embodiments 1 through 5 of the present invention are discussed as examples of SRAM in which each memory cell has a pair of bit lines, however, the present invention can also be applied to a DRAM (Dynamic Random Access Memory):, in which each memory cell has a single bit line.

In this case, the dummy memory cell regions should have a width greater than those of normal cell regions. In particular, a through-hole connecting between the first-layer and second-layer bit lines is provided on a normal cell region, and dummy cell regions are provided adjacent thereto along the line direction. The width of each dummy cell region may be extended so that the normal cell regions have no adverse impact due to the connection between the first-layer and second-layer bit lines.

Figure 13:
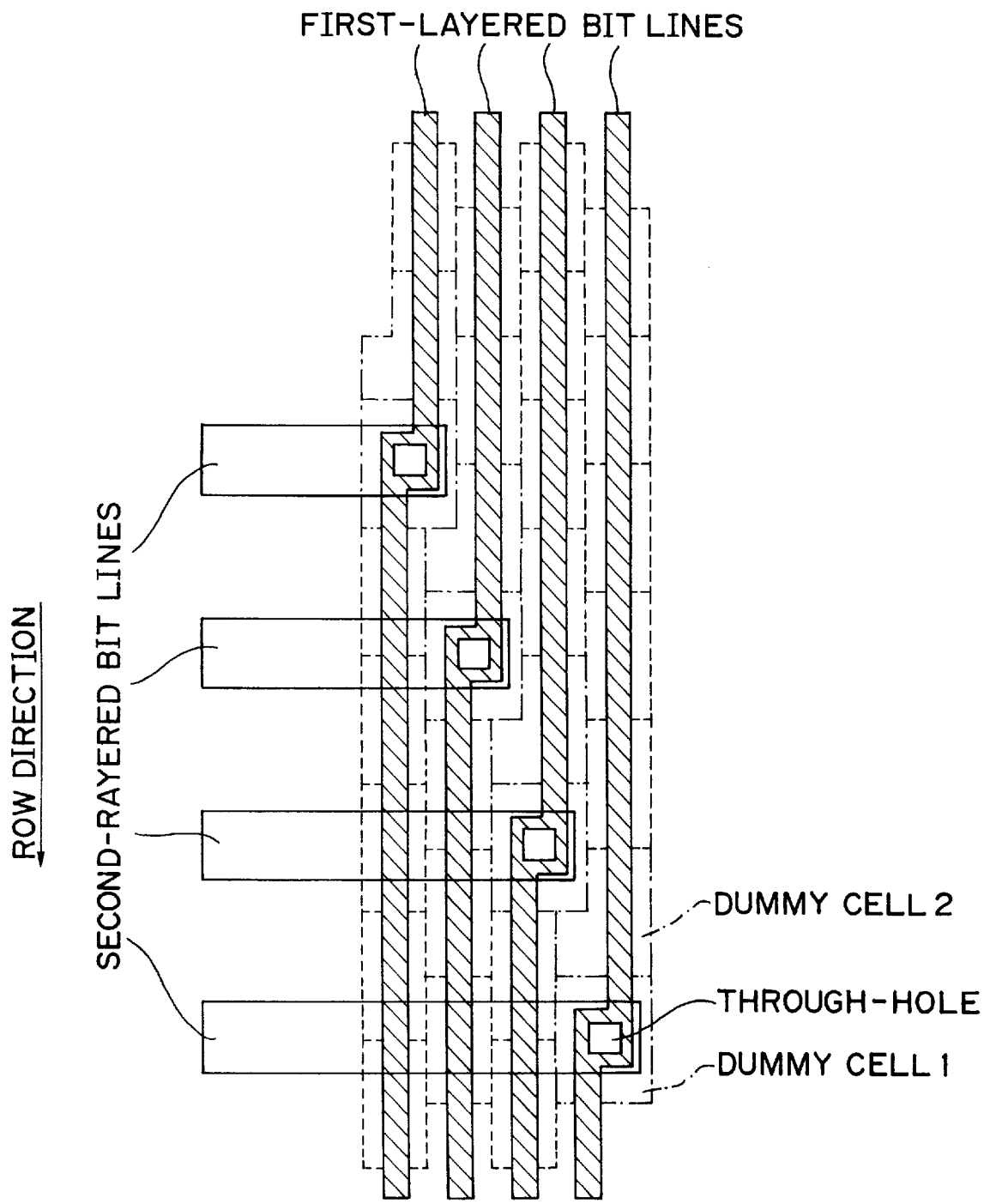
FIG. 13 is a design pattern of a memory cell array according to Embodiment 6 of the present invention.

Alternatively, as can be seen in FIG. 13, the through-hole connecting between the first-layer and second-layer bit lines can be provided on the dummy cell regions so that the normal cell regions have no adverse impact due to connection between the first-layer and second-layer. Thus, the through-hole can be arranged without extending the dimension along the line direction of each normal cell region.

According to the aforementioned embodiments, several examples are discussed, in which the bit lines are composed of the first-layer and second-layer metal wires, however, the bit lines may be made of any conductive layers such as poly-silicon wire layers and silicide layers as well as metal wires.

In accordance with this regard, the connecting holes between the first-layer and second-layer metal wires should not be limited to the through-holes, but may be any ones capable of electrically connecting therebetween, for example, poly-silicon contacts and silicide contacts.

Further, although the first-layer and second-layer bit lines are described in the above embodiments that they connect orthogonally to each other, they may connect obliquely or parallel to each other.

(Advantages According to the Present Invention)

The semiconductor memory device according to the present invention is so constructed and arranged as described above, several advantages can be enjoyed as follows.

According to the first invention, at least one of the memory cell regions, on which the connecting holes is provided, is the dummy cell region incapable of electrically performing the memory operation so that the first-layer and second-layer bit lines can be connected with each other without an extension of the width along the line direction of memory cell region of the normal cell capable of electrically operating as the memory cell.

According to the second invention, at least one of the memory cell regions adjacent to the memory cell regions along the line direction, on which the connecting holes is provided, is the dummy cell region so that the first-layer and second-layer bit lines can be connected with each other without an extension of the width of memory cell region.

According to the third invention, each memory cell is connected with a pair of the first-layer bit lines, and one of the pair of the first-layer bit lines is connected with one of the second-layer bit lines through the connecting hole arranged within the dummy cell region, while the another one of the pair of the first-layer bit lines is connected with one of the second-layer bit lines through the connecting hole arranged within the normal cell region, therefore, the first-layer and second-layer bit lines can be connected with each other without extension of the width of memory cell regions.

According to the fourth invention, two or four of the memory cell regions of the dummy cells are arranged in series along the row direction so that the memory cell array can be designed in a simple and regular manner.

According to the fifth invention, a plurality of dummy cell bit lines are connected with the dummy cells so as to maintain the dummy cells to a GND potential, thereby reducing the adverse affects to the normal cells.

According to the sixth invention, since each of the dummy cell bit lines is connected with the GND line, which is extending along the row direction of the memory cell array, no particular GND wire region for the dummy cell bit lines should be arranged.

According to the seventh invention, since each source-drain region of the load transistor is disconnected with any of the memory node portions, the dummy cell cannot serve the electrical memory operation.

What is claimed is:

1. A semiconductor memory device, comprising:
    a memory cell array including a matrix of memory cells arranged along line and row directions, each memory cell being formed within a memory cell region;
    a plurality of first-layer bit lines extending along the row direction, each provided on a plurality of said memory cell regions; and
    a plurality of second-layer bit lines, each of which is connected with said first-layer bit line via a connecting hole;
    wherein said memory cell regions include first memory cell regions on which said connecting hole is provided, and second memory cell regions on which said connecting hole is not provided, and
    wherein at least one of said memory cells formed within said first memory cell regions is a dummy cell incapable of serving an electrical memory operation.

2. The semiconductor memory device according to claim 1,
    wherein each memory cell is connected with a pair of said first-layer bit lines,
    one of said pair of said first-layer bit lines is connected with one of said second-layer bit lines through said connecting hole within said memory cell region of said dummy cell, and
    another one of said pair of said first-layer bit lines is connected with one of said second-layer bit lines through said connecting hole within said memory cell region of said memory cell capable of serving the electrical memory operation.

3. The semiconductor memory device according to claim 2,
    wherein two or four of said memory cell regions of said dummy cells are arranged in series along the row direction.

4. The semiconductor memory device according to claim 3, further comprising:
    a plurality of dummy cell bit lines connected with said dummy cells for maintaining said dummy cells to a GND potential.

5. The semiconductor memory device according to claim 4,
    wherein said memory cell array further includes a GND line extending along the row direction, each of said dummy cell is connected with said GND line via said dummy cell bit lines.

6. The semiconductor memory device according to claim 2, further comprising:
    a plurality of dummy cell bit lines connected with said dummy cells for maintaining said dummy cells to a GND potential.

7. The semiconductor memory device according to claim 5,
    wherein said memory cell array further includes a GND line extending along the row direction, each of said dummy cell is connected with said GND line via said dummy cell bit lines.

8. The semiconductor memory device according to claim 1,
    wherein each of said dummy memory cell includes a pair of memory node portions and a pair of load transistors with drain-source regions, and each drain-source region is disconnected with any of said memory node portions.

9. A semiconductor memory device, comprising:
    a memory cell array including a matrix of memory cells arranged along line and row directions, each memory cell being formed within a memory cell region;
    a plurality of first-layer bit lines extending along the row direction, each provided on a plurality of said memory cell regions; and
    a plurality of second-layer bit lines, each of which is connected with said first-layer bit line via a connecting hole;

wherein said memory cell regions include first memory cell regions on which said connecting hole is provided, and second memory cell regions on which said connecting hole is not provided, and wherein at least one of said memory cells formed within said memory cell regions adjacent to said first memory cell regions along the line direction is a dummy cell incapable of serving an electrical memory operation.

10. The semiconductor memory device according to claim 2, wherein each of said dummy memory cell includes a pair of memory node portions and a pair of load transistors with drain-source regions, and each drain-source region is disconnected with any of said memory node portions.

* * * * *